United States Patent
Kimura

(10) Patent No.: US 8,305,792 B2
(45) Date of Patent: Nov. 6, 2012

(54) COMPUTATION PROCESSING CIRCUIT USING FERROELECTRIC CAPACITOR

(75) Inventor: Hiromitsu Kimura, Kyoto (JP)

(73) Assignee: Rohm Co., Ltd. (JP)

( * ) Notice: Subject to any disclaimer, the term of this patent is extended or adjusted under 35 U.S.C. 154(b) by 1120 days.

(21) Appl. No.: 12/279,259

(22) PCT Filed: Feb. 13, 2007

(86) PCT No.: PCT/JP2007/000081
§ 371 (c)(1),
(2), (4) Date: Aug. 13, 2008

(87) PCT Pub. No.: WO2007/094133
PCT Pub. Date: Aug. 23, 2007

(65) Prior Publication Data
US 2009/0003031 A1    Jan. 1, 2009

(30) Foreign Application Priority Data

Feb. 13, 2006    (JP) .................................. 2006-035543

(51) Int. Cl.
*G11C 11/22* (2006.01)
(52) U.S. Cl. .................................. 365/145; 365/189.08
(58) Field of Classification Search ............... 365/49.13, 365/65, 109, 117, 145, 203, 205, 207, 189.011–189.11; 327/50–57; 257/295, E21.208, E21.663, 257/E21.664, E27.104, E29.164; 438/3
See application file for complete search history.

(56) References Cited

U.S. PATENT DOCUMENTS

| | | | |
|---|---|---|---|
| 6,094,370 A * | 7/2000 | Takashima | 365/145 |
| 6,205,047 B1 * | 3/2001 | Ogino | 365/145 |
| 6,320,782 B1 * | 11/2001 | Takashima | 365/145 |
| 2002/0027798 A1 * | 3/2002 | Takashima | 365/145 |
| 2002/0043676 A1 * | 4/2002 | Ohtsuka et al. | 257/295 |
| 2003/0058701 A1 * | 3/2003 | Takashima | 365/200 |
| 2004/0090812 A1 * | 5/2004 | Takashima | 365/145 |
| 2005/0063225 A1 * | 3/2005 | Takashima | 365/199 |
| 2006/0139844 A1 * | 6/2006 | Kameyama et al. | 361/272 |

FOREIGN PATENT DOCUMENTS

| | | |
|---|---|---|
| EP | 1591885 | 11/2005 |
| JP | 2000-57781 | 2/2000 |
| JP | 2004-264896 | 9/2004 |
| JP | 2004-355671 | 12/2004 |
| WO | 2004-070609 | 8/2004 |

OTHER PUBLICATIONS

International Search Report for International Application No. PCT/JP2007/000081 mailed Mar. 13, 2007 with English Translation.

(Continued)

*Primary Examiner* — Alexander Sofocleous
*Assistant Examiner* — Harry W Byrne
(74) *Attorney, Agent, or Firm* — Cantor Colburn LLP

(57) ABSTRACT

A computation processing device executes logic computation based upon input data X(t) and data X(t−1) stored in memory. A ferroelectric capacitor includes a first terminal and a second terminal, and provides a function as memory. A bit line driver switches the voltage to be applied to the first terminal or the second terminal of the ferroelectric capacitor. A sense amplifier outputs a computation result according to the voltage that occurs at either of the first terminal and the second terminal of the ferroelectric capacitor. For example, the bit line driver switches the direction of the voltage to be applied to the ferroelectric capacitor according to the input data X(t).

13 Claims, 7 Drawing Sheets

OTHER PUBLICATIONS

International Preliminary Report on Patentability for International Application No. PCT/JP2007/000081 issued Aug. 19, 2008 with English Translation.

Notification of Reason(s) for Refusal for Japanese Patent Application No. 2006-035543, dispatched Sep. 6, 2011, with English translation.

* cited by examiner

| S | X | OUT | S' |
|---|---|-----|----|
| 0 | 0 | 0   | 0  |
| 1 | 0 | 1   | 0  |
| 0 | 1 | 1   | 1  |
| 1 | 1 | 0   | 1  |

COMPUTATION PROCESSING CIRCUIT USING FERROELECTRIC CAPACITOR

CROSS REFERENCE TO RELATED APPLICATIONS

This is a U.S. national stage of application No. PCT/JP2007/000081, filed on 13 Feb. 2007. Priority under 35 U.S.C. §119(a) and 35 U.S.C. §365(b) is claimed from Japanese Application No.2006-035543,filed 13 Feb. 2006,the disclosure of which is also incorporated herein by reference.

BACKGROUND OF THE INVENTION

1. Field of the Invention

The present invention relates to a computation processing circuit which executes logic computation for digital data and a computation method thereof.

2. Description of the Related Art

In recent years, electronic devices having a configuration that includes a digital computation processing circuit which provides high-speed computation, such as a CPU (Central Processing Unit), a DSP (Digital Signal Processor), etc., and memory which stores data obtained by the computation processing circuit, have become standard. Improvement of the functions of these electronic devices involves a progressive increase in the amount of data to be handled by the computation processing circuit and the memory.

In the computation processing by the CPU or DSP, in general, steps for reading an operand from the memory and steps for writing an operand to the memory are sequentially performed. As a result, in such a computation processing circuit, memory access becomes bottlenecked in the computation processing.

In view of such a situation, the present applicant has developed a technique for configuring a logic computation processing circuit having both a function as a computation processing circuit and a function as memory using ferroelectric capacitors (see Patent documents 1 and 2, for example). Such a technique allows a computation step and a memory writing step to be executed at the same time, thereby improving computation processing performance.

Patent Document 1
  Japanese Patent Application Laid Open No. 2004-355671
Patent Document 2
  Japanese Patent Application Laid Open No. 2004-264896

SUMMARY OF THE INVENTION

The present invention has been made in view of such a situation. It is a general purpose of the present invention to further improve the computation performance of the computation processing circuit using ferroelectric capacitors.

An embodiment of the present invention relates to a computation processing circuit which executes logic computation based upon input data and data stored in memory. The computation processing circuit comprises: a ferroelectric capacitor which includes a first terminal and a second terminal, and which has a function as memory; a driver circuit which switches the voltage to be applied to the first and second terminals of the ferroelectric capacitor according to the input data; and a sense amplifier which outputs computation results according to the voltage that occurs at the first terminal or the second terminal.

With such an embodiment, desired computation processing can be executed by switching the voltage to be applied to the ferroelectric capacitor. Furthermore, the computation can be made in a state in which one operand is stored in the memory. This eliminates the readout processing, thereby improving the computation processing performance.

The driver circuit may switch the direction (polarity) of the voltage to be applied to the ferroelectric capacitor, according to the input data.

Also, when the input data is at a first level, the driver circuit may apply a voltage at a predetermined level such that the first terminal of the ferroelectric capacitor exhibits a higher electric potential than that of the second terminal. Furthermore, when the input data is at a second level that differs from the first level, the driver circuit may apply a voltage at the predetermined level such that the second terminal of the ferroelectric capacitor exhibits a higher electric potential than that of the first terminal.

With such an arrangement, voltage at a predetermined level is applied to the ferroelectric capacitor. Such an arrangement provides computation of the exclusive-OR of the input data and the data stored in the memory.

When the input data is at the first level, the driver circuit may apply a pulse signal to the first terminal of the ferroelectric capacitor. Furthermore, when the input data is at the second level, the driver circuit may apply a pulse signal to the second terminal of the ferroelectric capacitor.

Such an arrangement provides a function of suitably switching the direction of the voltage to be applied to the ferroelectric capacitor.

When the input data is at the first level, the sense amplifier may output a computation result according to the voltage that occurs at the second terminal of the ferroelectric capacitor. Furthermore, when the input data is at the second level, the sense amplifier may output a computation result according to the voltage that occurs at the first terminal of the ferroelectric capacitor.

With such an arrangement, the computation processing result can be output from the sense amplifier at approximately the same time as the data is written to the ferroelectric capacitor.

The driver circuit and the sense amplifier may provide destructive readout for the ferroelectric capacitor.

The driver circuit may switch the direction and the amplitude of the voltage to be applied to the ferroelectric capacitor according to the input data and the computation content (operation). Such an arrangement allows desired computation such as logical-OR computation, exclusive-OR computation, etc., to be performed by selecting a combination of the direction and the amplitude of the voltage to be applied to the ferroelectric capacitor.

Another embodiment of the present invention relates to a circuit which provides simultaneous multi-bit data computation processing.

With such an embodiment, the ferroelectric capacitors may be arranged in the form of a matrix having m rows and n columns (m and n are integers). Also, n driver circuits and n sense amplifiers may be arranged in increments of columns. The computation processing circuit may further include: n pairs of a first bit line and a second bit line arranged in increments of columns; m scanning lines arranged in increments of rows; and an address decoder which sequentially selects one from among the m scanning lines. Also, the first terminal and the second terminal of the ferroelectric capacitor in an i'th row of a j'th column (i and j are integers) may be connected to the first bit line and the second bit line of the j'th column via a switching device, the ON/OFF switching operation of which is controlled by means of the i'th row scanning line. Also, the j'th column driver circuit may apply a voltage to the first terminal or the second terminal of the ferroelectric capacitor via the first bit line or the second bit line of the j'th column.

With such an embodiment, the computation processing technique according to the present invention is applied to conventional memory circuit techniques. Such an embodiment provides simultaneous multi-bit data computation. Furthermore, such an embodiment allows the multi-bit data to be written to the memory.

The j'th column sense amplifier may be connected to the first bit line via a first output switch, and may be connected to the second bit line via a second output switch.

The above-described computation processing circuit may be monolithically integrated on a single semiconductor substrate. Examples of "arrangements integrally formed" include: an arrangement in which all the components of a circuit are formed on a semiconductor substrate; and an arrangement in which principal components of a circuit are integrally formed. Also, a part of the resistors, capacitors, and so forth, for adjusting circuit constants, may be provided in the form of components external to the semiconductor substrate. With such an arrangement, the computation processing circuit and the memory are integrally provided in the form of a single LSI, thereby reducing the circuit area.

Yet another embodiment of the present invention relates to a computation method. The computation method relates to a method for executing logic computation based upon input data and data stored in a ferroelectric capacitor which includes a first terminal and a second terminal, and which provides a function as memory. This method comprises: computation in which the voltage to be applied to the first terminal or the second terminal of the ferroelectric capacitor is set according to the input data, and the voltage thus set is applied to the ferroelectric capacitor; and readout in which computation result is output according to the voltage that occurs at either the first terminal or the second terminal of the ferroelectric capacitor. The computation and the readout may be executed approximately simultaneously.

With such an embodiment, desired computation processing can be executed by switching the voltage to be applied to the ferroelectric capacitor according to the input data. Furthermore, such an arrangement allows the computation to be performed in a state in which one operand is stored in the memory. This allows the readout processing to be eliminated, thereby improving the computation processing performance.

In the computation, when the input data is at a first level, a voltage at a predetermined level may be applied such that the first terminal of the ferroelectric capacitor exhibits a higher electric potential. Furthermore, when the input data is at a second level that differs from the first level, a voltage at a predetermined level may be applied such that the second terminal of the ferroelectric capacitor exhibits a higher electric potential.

Such an arrangement allows both the computation of the exclusive-OR and the writing of the input data to the ferroelectric capacitor to be performed.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIG. 6 is a truth table for the computation processing performed by the computation processing device according to the embodiment.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A and the member B are connected to each other" includes: a state in which the member A and the member B are physically and directly connected to each other; and a state in which the member A and the member B are indirectly connected to each other via another member that does not affect the electric connection therebetween.

In the same way, the state represented by the phrase "the member C is provided between the member A and the member B" includes a state in which these members are indirectly connected to each other via another member that does not affect the electric connection therebetween, in addition to the state in which the member A and the member C, or the member B and the member C are directly connected.

Figure 1:
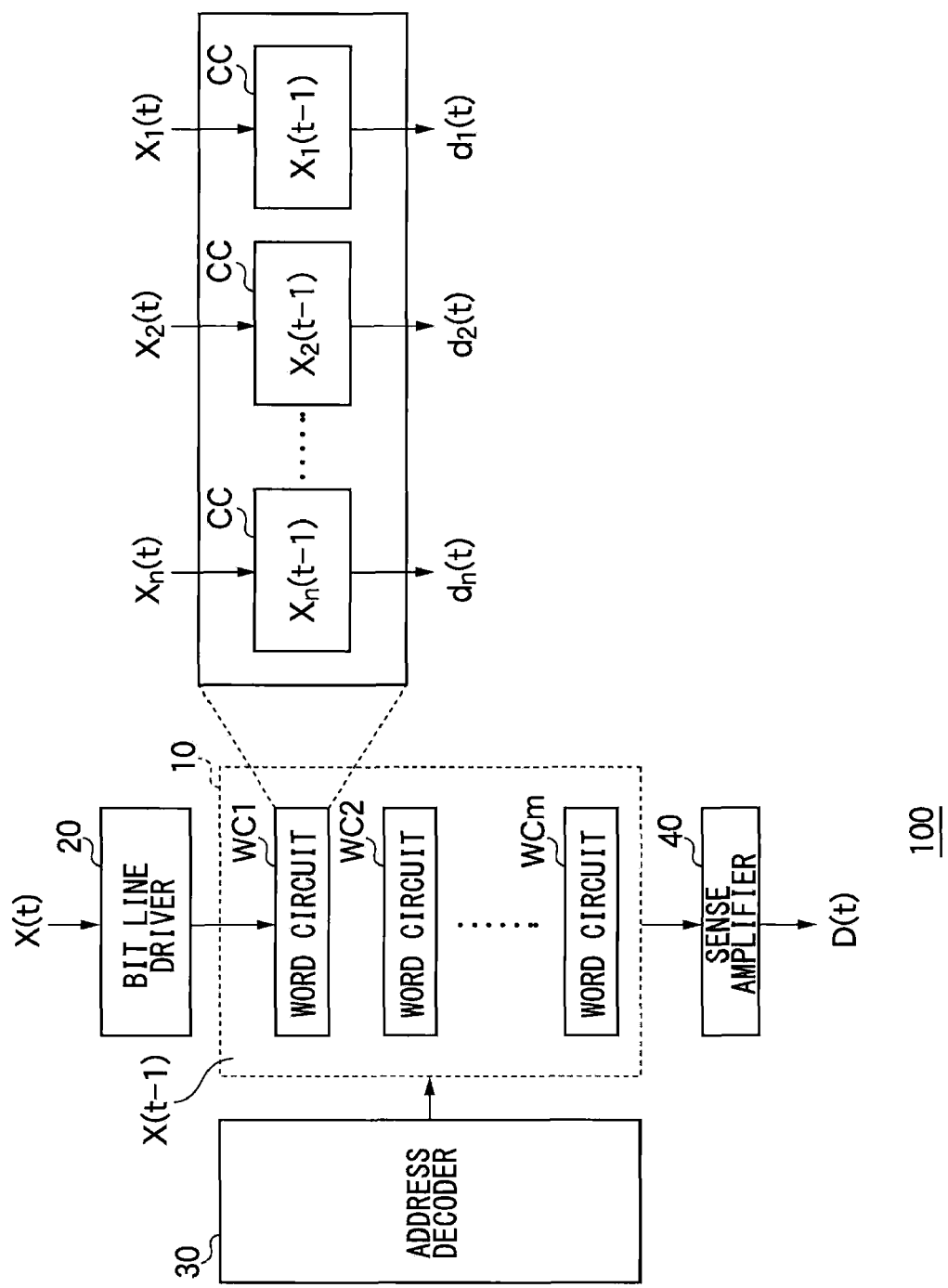
FIG. 1 is a block diagram which shows a configuration of a computation processing device according to an embodiment.

FIG. 1 is a block diagram which shows a configuration of a computation processing device 100 according to an embodiment. First, description will be made regarding the schematic configuration of the computation processing device 100. The computation processing device 100 includes multiple computation cells CC arranged in the form of a matrix having m rows and n columns (m and n are integers). Each computation cell CC has both a computation processing function and a memory function, which allows logic computation to be executed based upon the input data and the data stored in the memory. The computation processing device 100 is suitably used in the computation processing for image data that includes pixels in the form of a matrix having m rows and n columns, etc. The computation processing device 100 is preferably integrally formed on a single semiconductor substrate.

In general, in order to reduce the quantity of data, computation processing in image processing is often performed giving consideration to the difference between adjacent frame data sets. With the present embodiment, the difference between the frame data set X(t) acquired at a point in time t and the frame data set X(t−1) acquired at the point in time t−1, which is acquired before the point in time t, is computed for each pixel in the form of an exclusive-OR (XOR).

Description will be made below regarding the configuration of the computation processing device 100. The computation processing device 100 includes a logic array 10, a bit line driver 20, an address decoder 30, and a sense amplifier 40.

The logic array 10 has a configuration including m word circuits WC1 through WCm each of which is provided for a corresponding row of the matrix. Each of the word circuits WC1 through WCm includes n computation cells CC each of which is associated with a corresponding column of the matrix. With such a configuration, the computation cells CC are arranged in the form of a matrix having m rows and n columns. In order to differentiate these computation cells CC, the computation cell in the i'th row of the j'th column is represented by the reference numeral CCij, as necessary. Each computation cell CC is associated with a corresponding pixel of the frame data set to be subjected to computation processing.

Each computation cell CC of the logic array 10 has a memory function as described later. That is to say, at the point in time t1, the logic array 10 holds the frame data set X(t−1) acquired at the immediately previous point in time (t−1). With regard to each pixel, in this case, at the point in time t, each computation cell CC holds the pixel data acquired at the point in time (t−1).

The computation processing device 100 receives the frame data set X(t) at the point in time t as the input data. The computation processing device 100 computes the exclusive-OR of the frame data set X(t) thus input and the frame data set X(t−1) which is held by the logic array 10 and which was acquired at the immediately previous point in time (t−1).

The bit line driver 20 sequentially outputs the frame data X(t) thus input to the logic array 10 in increments of rows. When a data set output in units of words is the data set of the i'th row, the address decoder 30 selects the i'th row word circuit WCi, thereby executing computation processing. Furthermore, the word circuit WC thus selected by the address decoder 30 writes the frame data X(t) thus input to the memory, which is to be used in the next computation processing at the point in time (t+1), in addition to executing the computation processing.

The sense amplifier 40 outputs the difference data D(t) in increments of rows, which have been obtained in the computation processing in increments of the word circuits WC.

Figure 2:
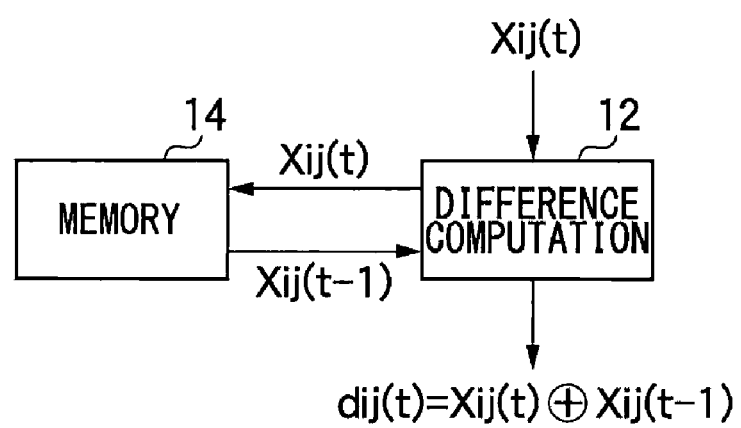
FIG. 2 is a schematic diagram which shows the configuration of a computation cell and the content of the computation processing.

Here, with regard to the operation of the computation cell CC in the execution of the aforementioned processing, FIG. 2 is a schematic diagram which shows the configuration of the computation cell CC and the computation processing. The computation cell CC includes a computation means 12 which executes the computation processing and a storage means 14 which provides a function as memory. The j'th column computation cell CCij receives the input data Xij(t) as input data. The computation means 12 reads out the data stored in the storage means 14, i.e., the input data Xij(t−1) which was acquired one step before, i.e., at the point in time (t−1). Furthermore, the computation means 12 computes the exclusive-OR of the input data Xij(t) and the Xij(t−1). The input data Xij(t) is written to the storage means 14 at approximately the same time as the completion of the computation processing.

Figure 3:
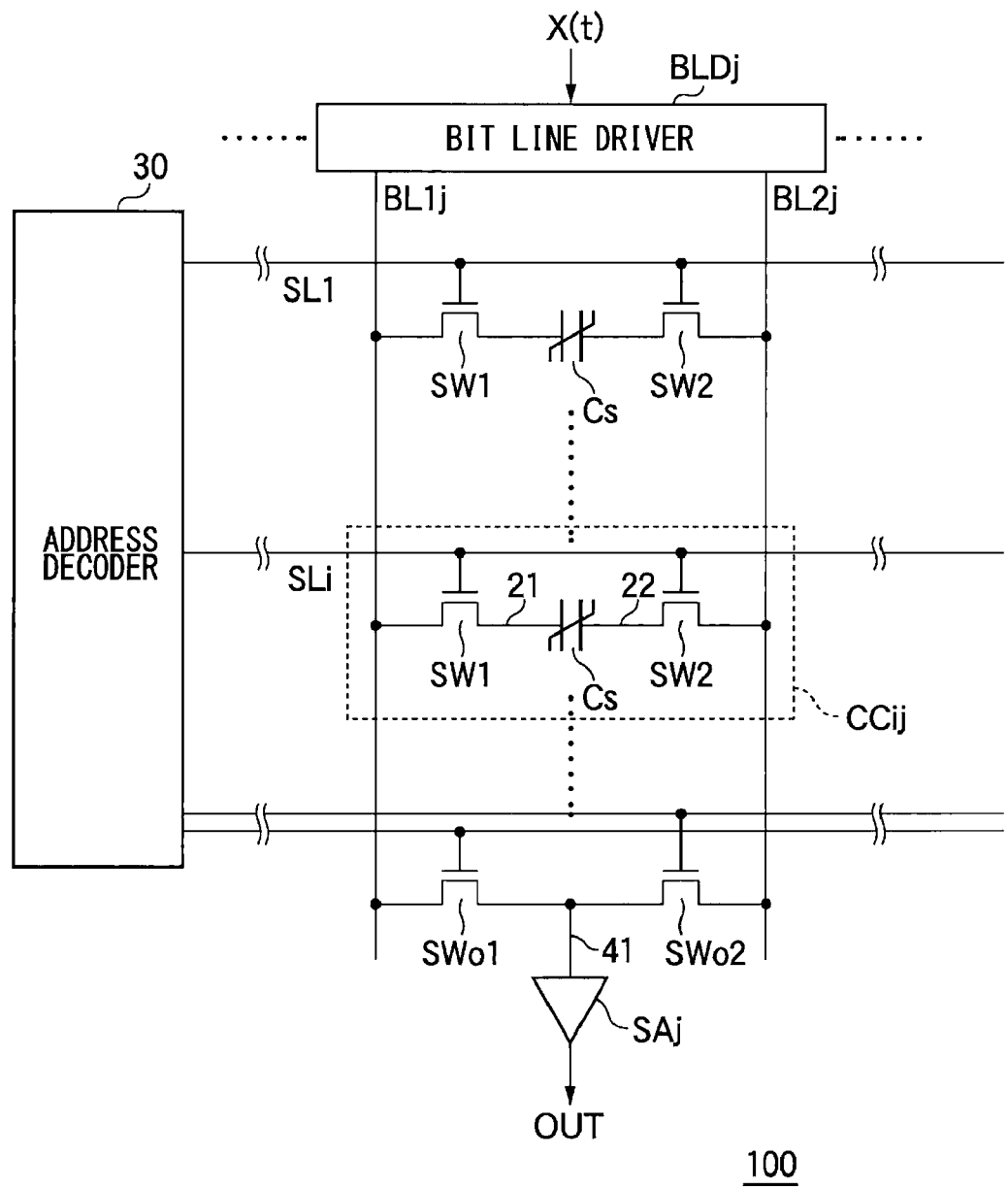
FIG. 3 is a detailed circuit diagram which shows the computation processing device shown in FIG. 1.

FIG. 3 is a detailed circuit diagram which shows the computation processing device 100 shown in FIG. 1. FIG. 3 shows only the components of the j'th row. As described above, the computation cells CC are arranged as elements of the i'th row and the j'th column of a matrix.

The bit line drivers BLD and the sense amplifiers SA are arranged in increments of columns of the matrix. That is to say, the bit line driver 20 shown in FIG. 1 includes bit line drivers BLD1 through BLDn provided in increments of columns. Also, the address decoder 30 includes sense amplifiers SA1 through SAn provided in increments of columns.

As shown in FIG. 3, n pairs of bit lines, each of which consists of a first bit line BL1 and a second bit line BL2, are arranged in increments of columns of the matrix. Furthermore, m scanning lines SL are arranged in increments of rows of the matrix. The computation cells CC are arranged at the intersections of the scanning lines SL and the n pairs of bit lines.

Each computation cell CC has a configuration including a ferroelectric capacitor Cs, a first switch SW1, and a second switch SW2.

The ferroelectric capacitor Cs includes a first terminal 21 and a second terminal 22, and provides a function as nonvolatile memory. According to the input data Xj(t), the j'th column bit line driver BLDj switches the voltage to be applied to the ferroelectric capacitor Cs via the first terminal 21 and the second terminal 22. With the present embodiment, the bit line driver BLD switches the direction of the voltage to be applied to the ferroelectric capacitor Cs, according to the input data Xj(t). In the present embodiment, let us say that the direction of the voltage applied when the second terminal 22 is at a higher electric potential is the "positive direction". Description will be made later regarding a method for applying the voltage by means of the bit line driver BLD.

The first terminal 21 of the ferroelectric capacitor Cs included in the i'th row computation cell CCij is connected to the j'th column first bit line BL1j via the first switch SW1, the ON/OFF operation of which is controlled via the i'th row scanning line SLi. On the other hand, the second terminal 22 of the ferroelectric capacitor Cs is connected to the j'th column second bit line BL2j via the second switch SW2, the ON/OFF operation of which is controlled via the i'th row scanning line SLi. When the first switch SW1 and the second switch SW2 in the i'th row are turned on by the address decoder 30, the computation cells CC in this row become active. In this stage, the computation processing and the memory access can be performed.

The sense amplifier SAj in the j'th column and the ferroelectric capacitor Cs arranged in the j'th column are connected via the first bit line BL1j and the second bit line BL2j. An input terminal 41 of the sense amplifier SAj is connected to the first bit line BL1j via a first output switch SWo1, and is connected to the second bit line BL2j via the second output switch SWo2.

The sense amplifier SAj in the j'th column selectively outputs the computation result that corresponds to the voltage that occurs at either of the first terminal 21 and the second terminal 22 of the ferroelectric capacitor Cs by selectively performing ON/OFF operations on the first output switch SWo1 and the second output switch SWo2.

Figure 4A:
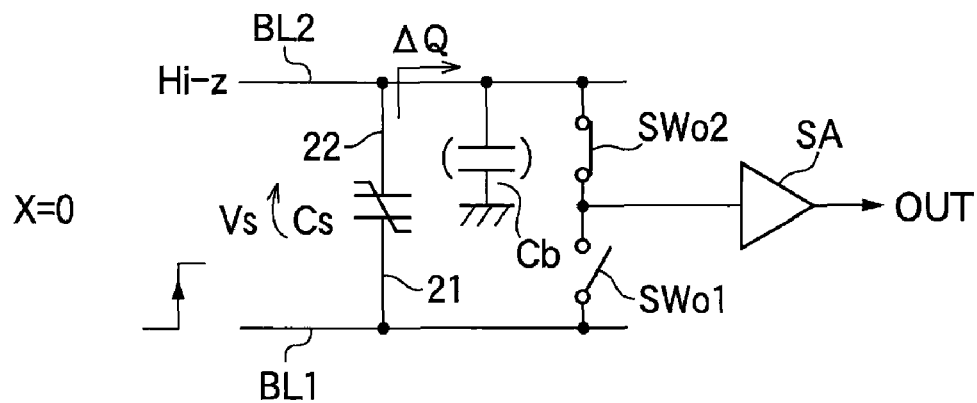
FIGS. 4A and 4B are circuit diagrams which show the states of a bit line driver and a sense amplifier in computation processing.
Figure 4B:
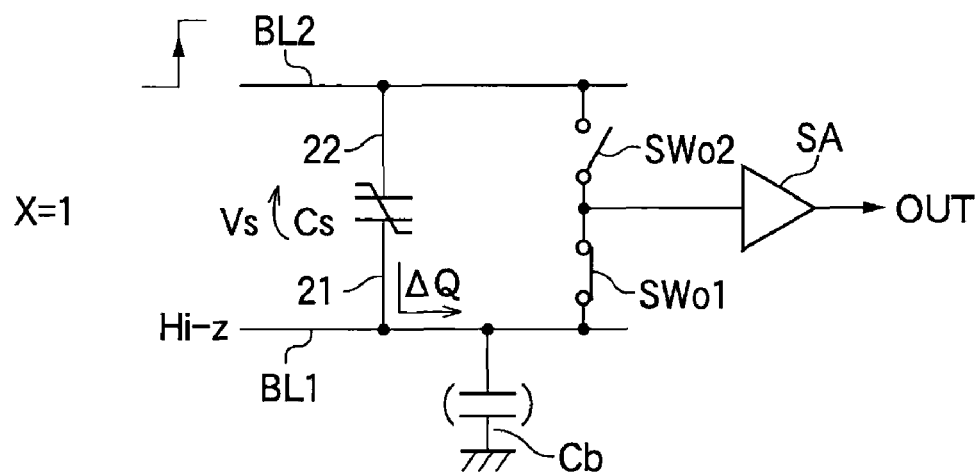

Description will be made regarding the computation processing and the memory access executed in the computation processing device 100 having the above-described configuration. FIGS. 4A and 4B are circuit diagrams which show the states of the bit line driver BLD and the sense amplifier SA in the computation processing. FIG. 4A shows the operation when the input data X(t) is at a first level (low level=0). FIG. 4B shows the operation when the input data X(t) is at a second level (high level=1).

Here, the ferroelectric capacitor Cs provides a function as memory, as described above. The data S (=Xj(t−1)) stored in the memory is associated with the levels of electric potential of the first terminal 21 and the second terminal 22. The state in which the first terminal 21 is at the higher electric potential corresponds to the first level (low level=0). The state in which the second terminal 22 is at the higher electric potential corresponds to the second level (high level=1).

As shown in FIG. 4A, when the input data Xj(t) is at the first level (low level), the bit line driver BLD applies a pulse signal to the first terminal 21 of the ferroelectric capacitor Cs via the first bit line BL1, and sets the second bit line BL2 to the high-impedance state. As a result, when the input data Xj(t) is at the low level (=0), voltage at a predetermined level is applied to the ferroelectric capacitor Cs such that the first terminal 21 exhibits a higher electric potential than that of the second terminal 22, i.e., the voltage is applied in the negative direction.

When a pulse is applied to the first terminal 21 of the ferroelectric capacitor Cs, charge $\Delta Q$ moves from the second terminal 22 to the capacitor Cb according to the application of the pulse. This changes the electric potential at the second terminal 22. When the input data Xj(t) is at the first level (low level), the second output switch SWo2 is set to the ON state. In this stage, the sense amplifier SA outputs the voltage that occurs at the second terminal 22 of the ferroelectric capacitor Cs.

Figure 5:
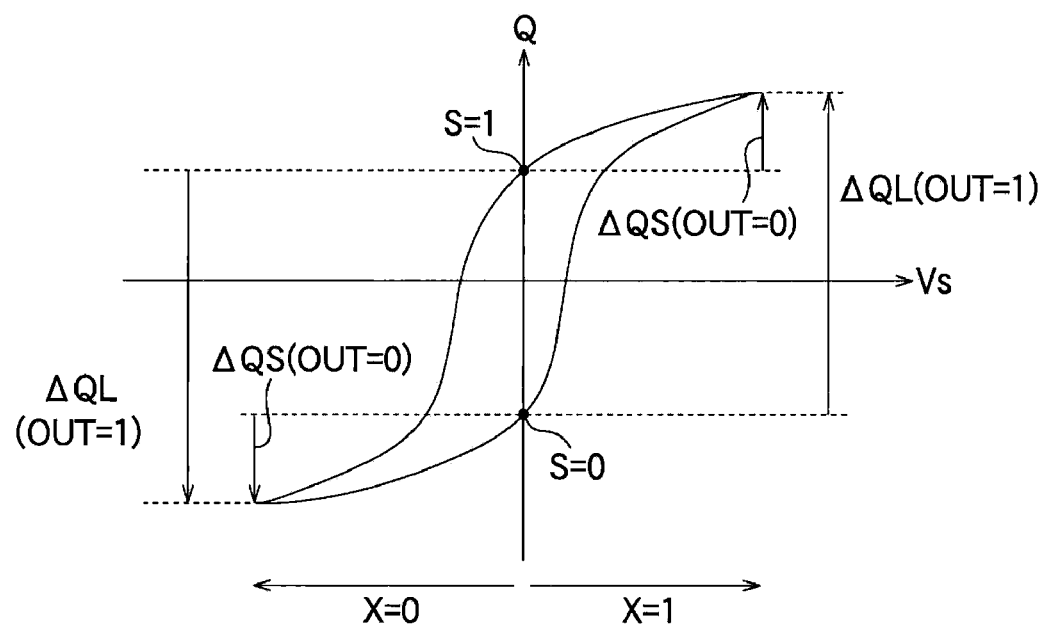
FIG. 5 is a diagram which shows the hysteresis of a ferroelectric capacitor.

With the present embodiment, the bit line driver BLD and the sense amplifier SA provide destructive readout. FIG. 5 shows the hysteresis of the ferroelectric capacitor Cs. When a pulse signal is applied to the first bit line BL1, the voltage is applied to the ferroelectric capacitor Cs in the negative direction. In this case, in a case in which the data S stored in the memory is at the low level (S=0), a small amount of charge $\Delta QS$ is transmitted from the second terminal 22 to the capacitor Cb. In this case, the sense amplifier SA outputs a signal at the low level (=0) according to such a small amount of charge $\Delta QS$.

On the other hand, let us consider a case in which the data S stored in the memory is at the high level (S=1). In this case, when a pulse signal is applied to the first bit line BL1, a large amount of charge $\Delta QL$ is transmitted to the capacitor Cb. In this case, the sense amplifier SA outputs a signal at the high level (=1).

Next, description will be made regarding a case in which the input data Xj(t) is at the second level (high level). As shown in FIG. 4B, when the input data is at the second level (high level), the bit line driver BLD applies a pulse signal to the second terminal 22 of the ferroelectric capacitor Cs via the second bit line BL2, and sets the first bit line BL1 to the high-impedance state. As a result, when the input data Xj(t) is at the high level (=1), voltage at a predetermined level is applied to the ferroelectric capacitor Cs in the positive direction such that the second terminal 22 exhibits a higher electric potential than that of the first terminal 21.

When a pulse is applied to the second terminal 22 of the ferroelectric capacitor Cs, charge $\Delta Q$ moves from the first terminal 21 to the capacitor Cb according to the application of the pulse. This changes the electric potential at the first terminal 21. When the input data Xj(t) is at the second level (high level), the first output switch SWo1 is set to the ON state. In this stage, the sense amplifier SA outputs the voltage that occurs at the first terminal 21 of the ferroelectric capacitor Cs.

As shown in FIG. 5, in a case in which the data S stored in the memory is at the low level (S=0), when a voltage is applied to the ferroelectric capacitor Cs in the positive direction, a large amount of charge $\Delta QL$ is transmitted from the first terminal 21 to the capacitor Cb. In this case, the sense amplifier SA outputs a signal OUT at the high level (=1) according to such a large amount of charge $\Delta QL$.

On the other hand, let us consider a case in which the data S stored in the memory is at the high level (S=1). In this case, when a pulse signal is applied to the second bit line BL2, a small amount of charge $\Delta QL$ is transmitted to the capacitor Cb. In this case, the sense amplifier SA outputs a signal at the low level (=0).

Figure 6:
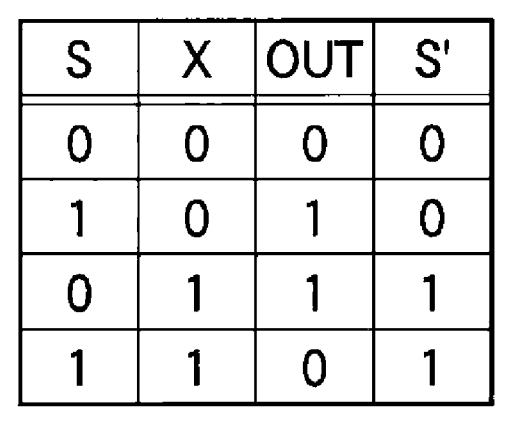

FIG. 6 shows a truth table for the computation processing performed by the computation processing device 100 according to the embodiment. When the input data is at the low level (X=0), the output data OUT matches the data S stored in the memory. On the other hand, when the input data is at the high level (X=1), the output data OUT matches the inverse of the data S stored in the memory. That is to say, the output data OUT matches the exclusive-OR of the input data X and the data S stored in the memory.

Let us examine the data S' written to the memory as a result of the computation processing. When a pulse signal is applied to the first bit line BL1, the state in which the first terminal 21 exhibits the higher electric potential is stored. As a result, the low-level state (=0) is stored as the new data S', regardless of the logical value of the data S previously stored. On the other hand, when a pulse signal is applied to the second bit line BL2, the high-level state (=1) is stored as the new data S'. That is to say, the ferroelectric capacitor Cs stores the input data X without change as the new data S'.

Figure 7:
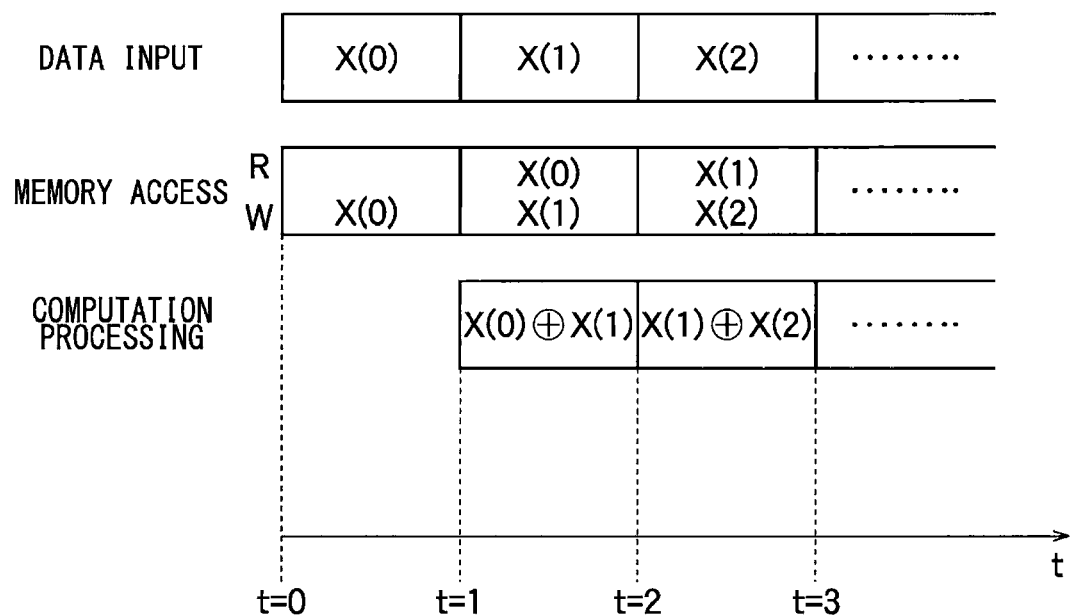
FIG. 7 is a time chart for the computation processing performed by the computation processing device according to the embodiment.

FIG. 7 is a time chart for the computation processing performed by the computation processing device 100 according to the embodiment. At the point in time t0, data X(0) is input, and is written to the memory, i.e., the ferroelectric capacitor Cs. Next, at the point in time t1, the data X(1) is input. The data X(1) is written to the memory. Approximately simultaneously, the exclusive-OR of the data X(1) and the data X(0) input at the point in time t0 is computed, and the exclusive-OR thus computed is output via the sense amplifier SA. Subsequently, at the point in time t2, the data X(2) is input. The data X(2) is written to the memory. Approximately simultaneously, the exclusive-OR of the data X(2) and the data X(1) is computed.

As described above, with the computation processing device 100 according to the present embodiment, desired computation processing can be executed by switching the voltage to be applied to each ferroelectric capacitor Cs according to the input data X(t). Furthermore, such an arrangement allows the computation to be made in a state in which one operand S(X(t-1)) is stored in the memory. This allows the readout processing to be eliminated, thereby improving the computation processing performance.

Furthermore, with such an arrangement, the bit line driver 20 switches the direction of the voltage to be applied to each ferroelectric capacitor Cs according to the input data X(t), thereby providing exclusive-OR computation.

The embodiments have been described for exemplary purposes only, and are by no means intended to be interpreted restrictively. Rather, it can be readily conceived by those skilled in this art that various modifications may be made by making various combinations of the aforementioned components or processes, which are also encompassed in the scope of the present invention.

For example, an arrangement may be made in which, according to the input data X(t) and the content of the logic computation, the bit line driver BLD switches the amplitude of the voltage to be applied to each ferroelectric capacitor Cs, in addition to the direction of the voltage. For example, in a case in which the bit line driver BLD applies a pulse with an extremely large amplitude, a large amount of charge $\Delta Q$ is transmitted to the capacitor Cb, regardless of the value of the data S stored in the memory. Accordingly, in this case, the output data OUT is set to the high-level state, Using this mechanism, such an arrangement provides other kinds of computation processing such as logical-OR (OR), in addition to the exclusive-OR described in the embodiment.

Description has been made in the embodiment regarding an arrangement in which the ferroelectric capacitors are arranged in the form of a matrix. However, the present invention is not restricted to such an arrangement. Also, the computation cells may be arranged in the form of a single line. Also, a single computation cell CC may be used as a computation processing circuit.

The application example of the computation processing device 100 according to the embodiment is not restricted to such an application for image processing. Also, the present invention can be widely applied to arrangements for executing computation processing such as encryption processing etc.

While the preferred embodiments of the present invention have been described using specific terms, such description is for illustrative purposes only, and it is to be understood that changes and variations may be made without departing from the spirit or scope of the appended claims.

The invention claimed is:

1. A computation processing circuit which executes logic computation based upon input data and data stored in memory, comprising:
    a ferroelectric capacitor which includes a first terminal and a second terminal, and which has a function as memory;
    a driver circuit which switches a voltage to be applied to the first and second terminals of the ferroelectric capacitor according to the input data; and
    a sense amplifier which outputs computation results according to the voltage that occurs at the first terminal or the second terminal, wherein
    the driver is configured to apply a voltage to the first terminal and to set the second terminal to a high-impedance state when the input data is at a first level, and to apply a voltage to the second terminal and to set the first terminal to a high-impedance state when the input data is at a second level.

2. A computation processing circuit according to claim 1, wherein the driver circuit switches the direction of the voltage to be applied to the ferroelectric capacitor, according to the input data.

3. A computation processing circuit according to claim 2, wherein, when the input data is at a first level, the driver circuit applies a voltage at a predetermined level such that the first terminal of the ferroelectric capacitor exhibits a higher electric potential than that of the second terminal,
    and wherein, when the input data is at a second level that differs from the first level, the driver circuit applies a voltage at the predetermined level such that the second terminal of the ferroelectric capacitor exhibits a higher electric potential than that of the first terminal.

4. A computation processing circuit according to claim 3, wherein, when the input data is at the first level, the driver circuit applies a pulse signal to the first terminal of the ferroelectric capacitor,
    and wherein, when the input data is at the second level, the driver circuit applies a pulse signal to the second terminal of the ferroelectric capacitor.

5. A computation processing circuit according to claim 3, wherein, when the input data is at the first level, the sense amplifier outputs a computation result according to the voltage that occurs at the second terminal of the ferroelectric capacitor,
    and wherein, when the input data is at the second level, the sense amplifier outputs a computation result according to the voltage that occurs at the first terminal of the ferroelectric capacitor.

6. A computation processing circuit according to claim 1, wherein the driver circuit and the sense amplifier provide destructive readout for the ferroelectric capacitor.

7. A computation processing circuit according to claim 1, wherein the driver circuit switches the direction and the amplitude of the voltage to be applied to the ferroelectric capacitor according to the input data and the computation content.

8. A computation processing circuit according to claim 1, wherein the ferroelectric capacitors are arranged in the form of a matrix having m rows and n columns (m and n are integers), and n driver circuits and n sense amplifiers are arranged in increments of columns,
    and which further includes:
        n pairs of a first bit line and a second bit line arranged in increments of columns;
        m scanning lines arranged in increments of rows; and
        an address decoder which sequentially selects one from among the m scanning lines,
    and wherein the first terminal and the second terminal of the ferroelectric capacitor in an i'th row of a j'th column (i and j are integers) are connected to the first bit line and the second bit line of the j'th column via a switching device, the ON/OFF switching operation of which is controlled by means of the i'th row scanning line,
    and wherein the j'th column driver circuit applies a voltage to the first terminal or the second terminal of the ferroelectric capacitor via the first bit line or the second bit line of the j'th column.

9. A computation processing circuit according to claim 8, wherein the j'th column sense amplifier is connected to the first bit line via a first output switch, and is connected to the second bit line via a second output switch.

10. A computation processing circuit according to claim 1, which is monolithically integrated on a single semiconductor substrate.

11. A computation method for executing logic computation based upon input data and data stored in a ferroelectric capacitor which includes a first terminal and a second terminal, and which provides a function as memory, comprising:
    applying a voltage to the first terminal and setting the second terminal to a high-impedance state when the input data is at a first level;
    applying a voltage to the second terminal and setting the first terminal to a high-impedance state when the input data is at a second level; and
    readout in which computation result is output according to the voltage that occurs at either the first terminal or the second terminal of the ferroelectric capacitor.

12. A computation method according to claim 11, in which the computation and the readout are executed approximately simultaneously.

13. A computation method according to claim 11, wherein, in the computation, when the input data is at a first level, a voltage at a predetermined level is applied such that the first terminal of the ferroelectric capacitor exhibits a higher electric potential,
    and wherein, when the input data is at a second level that differs from the first level, a voltage at a predetermined level is applied such that the second terminal of the ferroelectric capacitor exhibits a higher electric potential.

* * * * *